(12) United States Patent
Greco et al.

(10) Patent No.: US 7,300,825 B2
(45) Date of Patent: Nov. 27, 2007

(54) CUSTOMIZING BACK END OF THE LINE INTERCONNECTS

(75) Inventors: Nancy Anne Greco, Lagrangeville, NY (US); Stephen Edward Greco, Lagrangeville, NY (US); Erik L. Hedberg, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 10/835,953

(22) Filed: Apr. 30, 2004

(65) Prior Publication Data
US 2005/0242442 A1  Nov. 3, 2005

(51) Int. Cl.
*H01L 21/00* (2006.01)
(52) U.S. Cl. ............... 438/130; 438/585; 257/209; 257/E21.579
(58) Field of Classification Search ............ 438/130, 438/131, 4, 132, 585; 257/209, E21.579
See application file for complete search history.

(56) References Cited

U.S. PATENT DOCUMENTS 4,294,913 A * 10/1981 Moraw et al. ............ 430/396
5,753,417 A * 5/1998 Ulrich ....................... 430/312
6,589,881 B2 * 7/2003 Huang et al. ............. 438/725
2003/0003703 A1 * 1/2003 Barth et al. ............... 438/601
2004/0180295 A1 * 9/2004 Chang ....................... 430/313

* cited by examiner

Primary Examiner—Michelle Estrada
Assistant Examiner—Nicholas J. Tobergte
(74) Attorney, Agent, or Firm—Howard M. Cohn, Esq.; H. Daniel Schnurmann

(57) ABSTRACT

Custom connections between pairs of copper wires in a last damascene wiring level are effected by creating openings in an overlying insulating layer which span a distance between portions of the two wires, then filling the openings with aluminum. The openings can be created (or completed) by a second, maskless UV laser exposure of positive photoresist which is used for patterning the insulating layer. If an opening is not created, an aluminum connecting shape overlying the insulating layer will not effect a connection between the two wires. Similar results can be achieved by laser exposure of a resist used to pattern the aluminum layer, thereby causing breaks in connecting shape when it is desired not to have a connection.

27 Claims, 3 Drawing Sheets

CUSTOMIZING BACK END OF THE LINE INTERCONNECTS

BACKGROUND OF THE INVENTION

1. Technical Field

The invention relates to semiconductor device fabrication and, more particularly, to techniques for making custom connections between conductive lines (wires) of a wiring level.

2. Related Art

Modern integrated circuit (IC) chips make use of damascene wiring, from a few levels to ten or more levels. Damascene wiring is a process in which trenches and vias are formed in dielectric layers. Metal is deposited (in the trenches and vias), and excess metal is removed by means of chemical-mechanical polishing (CMP; planarization). This forms conductive lines (wires). At least two, and as many as ten or more such damascene layers (levels) may be formed. Copper (Cu) is becoming a material of choice for conductive lines (wiring, wires, conductors), due to its superior electrical characteristics. Copper exhibits about half the resistivity as compared with conventional aluminum (AlCu) wiring.

One way to take advantage of copper damascene wiring is to have a final aluminum level, which will be referred to herein as the "TM" level. (The term "TM" is not particularly meaningful, it can be thought of merely as an acronym for "top metal". It will be, however, used as an abbreviation throughout the descriptions that follow.) In one example, aluminum (AlCu) pads are put on top of the last damascene wiring level copper pads. (The copper pads are simply enlarged areas of the copper conductive lines.) The aluminum pads protect the underlying copper pads and also provide a surface on which to do conventional C4 (Controlled Collapse Chip Connection) metallurgy. In some cases, wiring is not permitted in the aluminum ("TM") level. Therefore, designs should be fully functional after the last copper level is completed. When the last copper wiring level is completed, the testing can be performed prior to forming the aluminum pads.

FIGS. 1A–1F illustrate an example of the copper damascene wiring with a final aluminum level, such as has been briefly described hereinabove. Only a relevant, top portion of an IC chip 100 of a semiconductor substrate (wafer) is shown—namely, a damascene interconnect structure.

Underlying damascene levels (wiring layers), underlying junctions and devices, and the underlying substrate (wafer) itself are well known and are omitted, for illustrative clarity.

As shown in FIG. 1A, a penultimate (n–1) damascene wiring layer 102 comprises a via 104 formed in (through) a dielectric (insulator) 106. The via 104 is filled (e.g., overfilled and CMP polished) with copper. In a next wiring layer 108, which is the last of the several Cu wiring levels, trenches (troughs) 110 are formed in (through) a dielectric (insulator) 112 and are filled with copper (which is then CMP polished). The last copper wiring level 108 typically has a thickness (vertical, in the figure, as viewed; perpendicular to the surface of the wafer) of approximately 1 µm (one micron) thick. (The terms "vias" and "trenches" are somewhat arbitrary when talking about damascene. They are both openings of various sizes and shapes through an insulating layer which are overfilled with conductor and then CMP planarized.)

After the last copper wiring level 108 is formed, a diffusion barrier cap 114 is deposited (atop the last copper wiring level) which is typically silicon nitride having a thickness of approximately 1000 Å (Angstroms). Next, a "LV" insulator (insulating layer) 116 is deposited (atop the diffusion barrier cap) which is typically silicon oxide having a thickness of approximately 5000 Å, followed by more silicon nitride (not shown) typically having a thickness of approximately 5000 Å. (The term "LV" is not particularly meaningful, it can be thought of merely as acronym for "Last Via". It will however be used as an abbreviation throughout the description that follows.)

Next, as shown in FIG. 1B, photoresist ("resist") 120 is deposited (coated) on top of the LV insulating layer 116. A LV mask 124, typically comprising a sheet of opaque material (e.g., chrome) having a plurality of openings 126 disposed therein, is located atop the LV resist 120. Then, using conventional photolithography, the resist 120 is exposed to light (arrows) through the mask openings 126, selectively altering the solubility of exposed portions of the LV resist 120 (lithographically defining openings 122 which will be made in the LV resist 120). The LV resist 120 is "positive" photoresist. "Positive" photoresist is initially insoluble, and becomes soluble as a result of radiation. ("Negative" photoresist is initially soluble, and becomes insoluble as a result of radiation.) In the developing process, the illuminated portions of the resist, which have become soluble, will be washed away, and the remaining un-illuminated portions of the resist, which remain insoluble, will act as a mask for subsequent etching, protecting the material (in this case, LV insulator) underlying these remaining portions of the resist. In other words, with positive resist you shine light on the resist where you want to etch (remove) material which is under the resist. With negative resist, you would shine light on the resist where you want to protect underlying material from being etched. The LV mask 124 is product specific—that is, it is designed to form identical features which will be present on every iteration of the product—in this case, aluminum pads (140; FIG. 1F) extending to and making a "regular" connection with selected ones of corresponding underlying copper wires, as described in further detail hereinbelow. The LV resist 120 is exposed with pad shapes corresponding to the aluminum pads (140) which will be formed.

The LV resist 120 is then developed, washing away the soluble portions (not shown) thereof, the insoluble portions remaining and defining openings 122 in the LV resist 120 over selected portions (e.g., "pad" areas, 118, better viewed in FIG. 1C) of the copper of the last copper wiring level 108. Generally, these openings 122 are relatively large in area (and low aspect ratio), typically having a width (left-to-right, as viewed; parallel to the surface of the wafer; also into the page) on the order of 10's to 100 µm. Thus, it can readily be observed that the drawing figures are "compressed", widthwise, for illustrative clarity. If they were not compressed, they would be much wider than the page. The "pad" areas 118 of the copper of the last copper wiring level 108 are also relatively large in area as contrasted with conductive line portions of the copper which may typically only have a width of a few microns, or less.

Next, as shown in FIG. 1C, after the LV resist 120 has been developed (and the LV mask 124 has been removed), the LV insulator layer 116 and barrier cap 114 are then reactive ion etched (RIE) away (arrows) in the areas where there is no LV resist 120, so that first openings 128 are formed in (through) the LV insulator layer 116 and barrier cap 114 and extend to the selected pad areas 118 of the copper of the last copper wiring level 108. Not all the copper wires of the last copper wiring level need to have pads, only selected ones. The remaining LV resist 120 is then cleared off the LV insulator 116.

Next, as shown in FIG. 1D, after LV insulator RIE and resist clearing, aluminum metallization ("TM" level) is performed, which comprises depositing a thin barrier layer (not shown) such as 500 Å of tantalum nitride (TaN), followed by a blanket deposition of approximately one micron (1 µm) thick of TM aluminum (metal) 130. The TM aluminum 130 is conventional aluminum/copper (AlCu) comprising approximately 99.5% aluminum. The barrier layer (not shown) of titanium (Ti) or titanium nitride (TiN) or combinations can be deposited before the TM aluminum 130, for adhesion (to the underlying copper) and good contact resistance. And, if the TM aluminum 130 were intended to carry current along the wafer plane, a thin layer (not shown) of Ti/TiN could be deposited on top of the TM aluminum 130, for increased reliability. As shown in FIG. 1D, the aluminum 130 overfills the openings 128 in the LV insulator 116, and there is "excess" aluminum on the top surface of the LV insulator 116. The "excess" aluminum is generally that portion of the aluminum 130 which is not within (or immediately adjacent) an opening 128 in the LV insulator 116.

At this stage of the process, the excess TM aluminum 130 (and the adjoining metallic (e.g., TaN, TiN) layers) could be removed by CMP (chemical-mechanical polishing), in a manner similar to the underlying copper damascene levels, leaving aluminum pads in the openings 128 of the LV insulator 116, directly over and electrically connected with the copper pads 118. (This clears the top surface of the LV insulator of excess aluminum.) However, in this process, the TM aluminum 130 and the adjoining metallic (e.g., TaN, TiN) layers are patterned by conventional metal reactive ion etching (RIE), as follows.

As shown in FIG. 1E, a layer of TM resist 132 is deposited on the TM aluminum 130. The TM resist 132 is also positive resist. A TM mask 134, comprising a sheet of opaque material (e.g., chrome) having a plurality of openings 136 disposed therein, is disposed atop the resist 132. Then, using conventional photolithography, the TM resist 132 is exposed to light (arrows) through the TM mask openings 136, selectively altering the solubility of exposed portions of the TM resist 132. The TM resist 132 is then developed, washing away the soluble portions (not shown) thereof, the insoluble portions remaining. This leaves portions of TM resist 132 over the TM aluminum 130 which is over the pad portion 118 of the copper of the last copper wiring level 108.

Next, the exposed (not covered by resist) portions of the TM aluminum 130 are etched, using any suitable technique such as dry (plasma) etching, to leave aluminum pads 140 over and in electrical contact with the last wiring level copper pads 118. The edges of the TM aluminum pads 140 generally overhang the LV insulator 116, so that the edges of the aluminum pads 140 are on top of the LV insulator 116. C4 contacts or wire bonds can then be formed on the aluminum pads 140. The resulting product is shown in FIG. 1F. Subsequent layers of insulation (not shown) would be deposited, as is known. Again, it should be understood that FIGS. 1A–1F are greatly compressed (out-of-scale) in the widthwise direction. In reality, the pad 140 would be several times as wide as the page, presenting a suitably large surface area for C4 contact formation. (FIG. 1F is indeed shown with "break lines" indicating that the overall structure is wider than shown.) The process described with respect to FIGS. 1A–1F could be implemented with negative rather than positive LV resist 120 and with negative rather than positive TM resist 132.

Modern semiconductor chips can be complex mixtures of various "functions"—they can have multiple arithmetic units, data storage units, clocking units, fetching units, sequencing units, receiving and transmitting units. After all process levels are fabricated, a certain amount of testing is performed. Such tests might determine basic functionality or if certain blocks are working. Architecture decisions can be made at that point, based on yield and performance speed sort data, about whether to connect or disconnect certain functions to other designs on the chip, in order to satisfy multiple customer requests and optimize product yield. The test data can be fed forward to conventional infrared laser fuse blow tools. The present invention relates to semiconductor device fabrication and, more particularly, to techniques for making custom connections between conductive lines (wires) of a wiring level.

Back End of Line (BEOL) laser fuse blow is used to break connections. Because of insulator damage and potential for corrosion at blown fuse sites, and potential for reconnection through electromigration, each technology requires rigorous fuse qualification studies. (BEOL typically means after final metallization—more specifically, in the context of the present invention, after final wiring (copper) level has been completed and the design is fully functional.)

Front End of Line (FEOL) E-fuses are also used to break connections, but they typically leave high resistance (as opposed to essentially infinite resistance) and so are not suitable for some (e.g., high current) applications.

Poly-diffusion anti-fuses and metal-metal antifuses are used to form connections in programmable ASICs, but the resulting connections are typically of relatively high resistance, and so are also not suitable for some (e.g., high current) applications.

Laser assisted chemical vapor deposition (CVD) metal deposition or focussed ion beam techniques can be used to selectively deposit conductors and thus make custom electrical connections, but these are typically very slow processes and they require specialized vacuum equipment.

There exists a need for making and breaking connections that does not suffer from the aforementioned limitations of the prior art techniques.

Infrared (IR) light has a wavelength of 750 nm–1 mm. Visible light has a wavelength of 400–750 nm. Ultraviolet (UV) radiation has a wavelength of 100–400 nm. 1 millimeter (mm; $10^{-3}$ meters)=1000 micron (µm; $10^6$ meters). 1 µm=1000 nanometers (nm; $10^{-9}$ meters)=10,000 Angstroms (Å; $10^{-10}$ meters)

Excimer lasers are capable of generating very shortwavelength (below 200 nm) UV radiation. For example, an ArF (argon-fluorine) excimer laser has a wavelength of 193 nm and is suitable for 150 nm (0.15 micrometer) geometry exposure, a KrF (krypton-fluorine) excimer laser has a wavelength of 248 nm and is suitable for 180 nm (0.18 (m)) exposure, and a F2 (fluorine) excimer laser has a wavelength of 157 nm and is suitable for exposure of 130 nm patterns (possibly even smaller). Many excimer lasers operating in the UV range are known.

SUMMARY OF THE INVENTION

The invention is generally directed to a "maskless" means of making "on wafer" custom connections between wires that would not otherwise be connected, or a maskless means of deleting (comparable to breaking) connections between wires which would otherwise be connected. Both are done at points late in wafer build (e.g., BEOL). The ability to "customize" circuit wiring without having to build product specific masks to do such customization could potentially yield large cost savings. By "maskless", it is meant that the custom connections can be made without requiring a specific mask for each die. As described in greater detail hereinbelow, this usually involves exposing areas of resist with either UV laser or with a "generic" mask which can be stepped around the wafer. This is in contrast to the "normal" masks (e.g., LV and TM masks, described hereinabove), which are product specific, and can be used with steppers to make many millions of identical die.

Generally, custom connections or custom disconnects are made by UV laser or stepper exposure of LV or TM resist at selected sites (after the "normal" LV or TM mask exposure). Connections between two or more last copper level copper wires are made by forming aluminum connecting shapes (wires, jumpers) from the TM aluminum material discussed hereinabove. Disconnects are made by 'breaking' (preventing the formation of complete connections from the TM aluminum). The resulting connections can be of very low resistance, and disconnects can be of essentially infinite resistance (without the insulator damage and corrosion concerns of conventional BEOL laser fuse blow).

As mentioned above, modern semiconductor chips can be complex mixtures of various "designs"—they can have multiple logic cores or microprocessors, arithmetic processors, clocks, cache, etc.—namely, multiple functions on a chip. According to the invention, generally, after all levels of copper (e.g., damascene copper wiring, such as described above) are built, a certain amount of functional test can be performed if desired, followed by appropriate cleaning techniques to remove probe debris. Such tests might determine basic functionality (whether a core, processor, etc. is working or not) or at what speeds certain blocks are working. Decisions can be made at that point, based on yield and speed sort data, about whether to connect or to not connect certain designs to other designs on the chip using the invention described here, in order to satisfy multiple customer requests and optimize product yield. The functional test data could be fed forward to a UV laser tool or to the stepper regarding which connections on which chips to open (disconnect, prevent, delete) or to close (connect) in much the same manner as test data is fed forward to conventional infrared laser fuse blow laser tools. Combinations of custom connect and custom disconnect could even be done on the same chip by, for instance, employing laser exposures at both LV and TM levels. The invention could also be used in conjunction with standard laser fuse blow in order optimize productivity (for instance, some smaller number of connections could be broken at TM in areas where normal fuse blow damage might be too much of a concern, and then additional connections could be broken in standard fuse bays after C4). In addition, disconnects could potentially be done after the first TM reactive ion etch (RIE), at the expense of employing another resist coat, another laser expose in selected areas, and another metal RIE.

According to the invention, a method is provided for making connections to wires in a wiring level of a damascene interconnect structure comprising: depositing an insulating layer atop the wiring level; depositing a first photoresist on the insulating layer; in a first exposure step, exposing first shapes in the first photoresist so that in a subsequent insulating layer etch, first openings will be formed through the insulating layer extending to selected areas of selected ones of the wires; in a second exposure step, exposing second shapes in the first photoresist so that in the subsequent insulating layer etch, second openings will be formed through the insulating layer extending to portions of pairs of the wires which are desired to be connected; performing the subsequent insulating layer etch so that the first openings and second openings are formed through the insulating layer; and performing metallization, wherein metal fills the first openings the second openings in the insulating layer. The metallization is patterned to form connecting shapes for all possible connections. Connection shapes which are on (and extend into) the second openings effect connections between pairs of wires which are desired to be connected. Connectins shapes which are not on (and do not extend into) the second openings do not effect connections between pairs of wires which are desired to be connected. Typically, a mask is used for performing the first exposure step; and a UV laser is used to perform the second exposure step. However, a second mask having generic openings can be used (with a stepper) to create the second openings.

According to an aspect of the invention, in cases where the wires desired to be connected are far apart, the first openings in the insulating layer includes third openings in the insulating layer which extend only partially between the portions of pairs of the wires which are desired to be connected; and in the second exposure step, the third openings are enlarged to become the second openings.

In an alternate embodiment of the invention, openings are formed through the insulating layer over portions of pairs of conductive lines for making all possible connections between pairs of conductive lines; metal is deposited on the insulating layer and in the openings; photoresist is deposited atop the metal. Then, in a first exposure step, the photoresist is exposed so that in a subsequent metal etch, metal connection shapes will be formed on the insulating layer over all possible pairs of wires which can be connected and, without a second exposure step, complete connecting links will be formed between pairs of conductive lines which are desired to be connected; and in the second exposure step, portions of the photoresist are exposed so that in the subsequent metal etch, some of the metal connection shapes will only partially be formed, thereby forming incomplete connecting links between pairs of conductive lines which are not desired to be connected. Again, a mask can be used for the first exposure step and a UV laser can be used to perform the second exposure step. Or, a second mask having generic openings to perform the second exposure step.

In an alternate embodiment of the invention, in the first exposure step of resist atop the insulating layer, first portions of the photoresist are exposed so that in a subsequent insulating layer etch, openings can be formed through the insulating layer extending to portions of selected pairs of the wires; and in a second exposure step, second portions of the photoresist are exposed so that in the subsequent insulating layer etch, the second openings will only partially be formed, thereby forming incomplete connecting links between selected pairs of wires; and all possible connection shapes are formed in the metallization; thereby forming complete connecting links between pairs of wires which are desired to be connected and forming incomplete connecting links between pairs of conductive lines which are not desired to be connected.

According to the invention, an IC chip formed using the techniques described herein will have a level of damascene wiring comprising a plurality of wires; an insulating layer atop the level damascene wiring; first openings through the insulating layer for connecting on a one-to one basis to selected ones of the wires; second openings through the insulating layer for connecting selected pairs of wires, wherein a single second opening in the insulating layer spans a distance between a selected pair of wires; and metallization filling the first and second openings in the insulating layer. Generally, the damascene wiring comprises copper; and the metallization comprises aluminum. The damascene wiring may comprise last level damascene wiring.

Potential uses of the invention include, but are not limited to:

1) Disconnect unwanted circuit function
2) Repair circuits via fault tolerant design methodology or redundancy
3) Invoke spare circuitry to recover from design errors
4) Change net delays for performance optimization (both late paths and early paths)
5) Define voltage islands
6) Chip function personalization to customer needs
7) Array repair
8) Analog circuit tuning (PLLs, Regulators, & Reference bias circuits)
9) Input/Output (I/O) impedance tuning
10) Power up & power down devices

BRIEF DESCRIPTIONS OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. (An overall figure may be out-of-scale; for example, greatly compressed widthwise to fit on the page.) The cross-sectional views may be in the form of "slices", or "near-sighted" cross-sectional views, omitting certain background lines which would otherwise be visible in a "true" cross-sectional view, for illustrative clarity.

DETAILED DESCRIPTION OF THE INVENTION

Figure 1A:
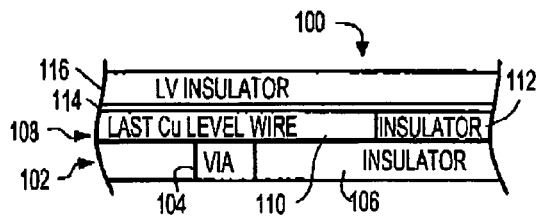
FIGS. 1A–1F are cross-sectional view of a technique for forming damascene wiring and aluminum pads atop copper pads, according to the prior art.
Figure 1B:
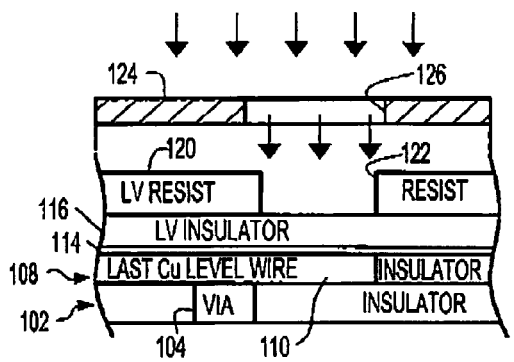

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

In the drawings accompanying the description that follows, often both reference numerals and legends (labels, text descriptions) will be used to identify elements. If legends are provided, they are intended merely as an aid to the reader, and should not be interpreted as limiting. In some cases, legends may be provided in lieu of reference numerals. Certain other "shorthand" designations may be used, throughout the figures, such as omitting reference numerals from repetitive presentations of like portions of similar drawings, for illustrative clarity.

Figure 1C:
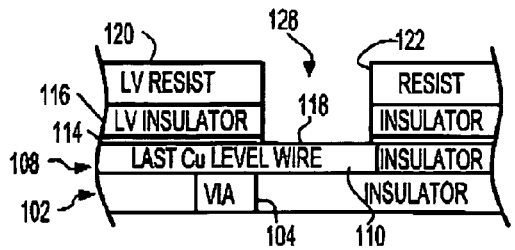
Figure 1D:
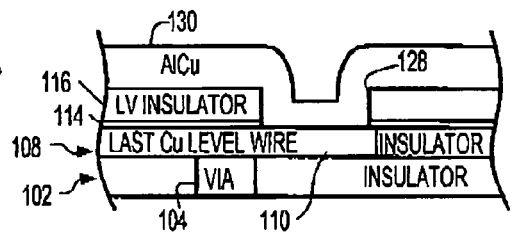
Figure 1E:
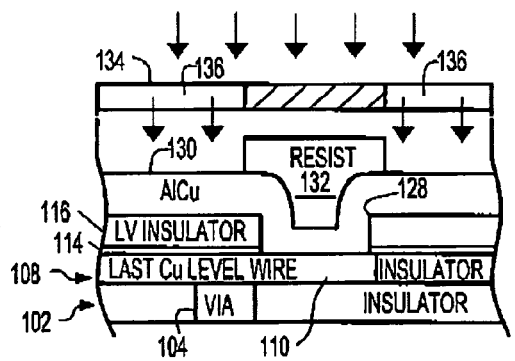
Figure 1F:
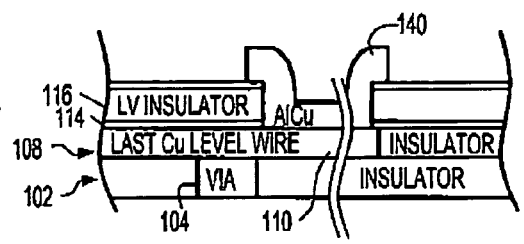
Figure 2:
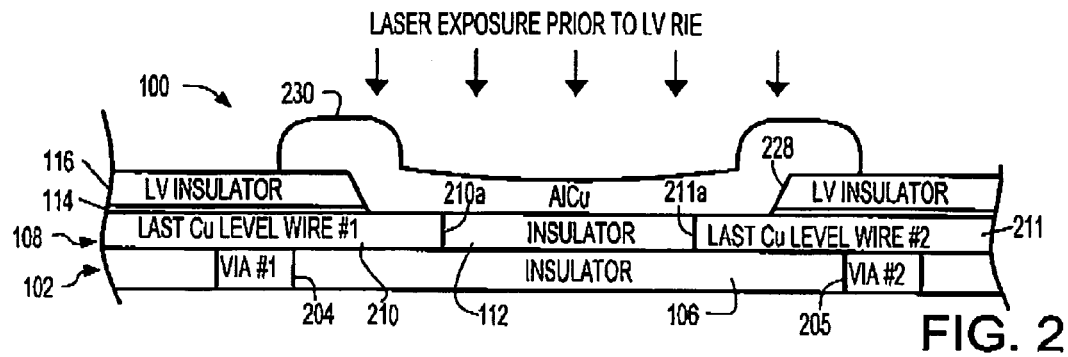
FIGS. 2 and 2A are a cross-sectional views of an embodiment of the invention wherein a custom connection is selectively made (FIG. 2) or not made (FIG. 2A) between two or more last level copper wires.

FIG. 2 illustrates an embodiment of the invention. The present invention is intended to work in conjunction with techniques such as have been described hereinabove with respect to FIGS. 1A–1F, but should not be construed as being limited only to working with the structure and techniques shown and described with respect to FIGS. 1A–1F. What is being shown in FIG. 2 is happening at another location on the IC chip 100 than what is happening in FIGS. 1A–1F. For this reason, the IC chip is labeled "100". Generally, as described hereinabove, TM aluminum pads (140) are formed over last copper level pads (118). Generally, as described hereinbelow, a custom connection is made between two or more last level copper wires, by a TM aluminum connecting link (e.g., 230), by further exposing the positive LV photoresist (120), using UV laser or a separate mask having one or more generic openings, prior to LV insulator RIE (FIG. 1C).

Whereas in FIGS. 1A–1F an aluminum pad (140) was formed over a copper pad (118), making a "regular" connection to an underlying last level copper wire on a one-to-one basis, in the present invention an aluminum connecting link (230) is formed over portions (210a, 211a) of two distinct copper lines (210, 211) thereby effecting a custom connection on a die-by-die (per die, rather than per product) basis between the two copper lines (210, 211). Many such custom connections can be made, per die. Several die can have the same custom connections made for "personalizing" the die. Various die can have specific connections made as a result of testing to correct for deficiencies (e.g., invoke redundancies) and the like.

The penultimate (n−1) damascene wiring layer 102 (a different portion of the same layer 102 which is shown in FIG. 1A) comprises two spaced-apart vias "Via #1" 204 and "Via #2" 205 formed in (through) the dielectric (insulator) 106 (a different portion of the same dielectric insulator 106 which is shown in FIG. 1A). The two vias 204, 205 are coplanar with one another. The vias 204, 205 are filled (e.g., overfilled and CMP polished) with copper. In the next wiring layer 108 (a different portion of the same layer 108 which is shown in FIG. 1A), which is the last of the several Cu wiring levels, two spaced-apart trenches 210 and 211 (compare 110) are formed in (through) the dielectric (insulator) 112 (a different portion of the same dielectric insulator 112 which is shown in FIG. 1A) and are filled with copper (which is then CMP polished). This forms two distinct (not connected to one another) copper wires, as shown, designated "Last Cu Level Wire #1" and "Last Cu Level Wire #2", respectively.

Last Cu Level Wire #1 is atop and in contact with Via #1. Last Cu Level Wire #2 is atop and in contact with Via #2. Last Cu Level Wire #1 is coplanar with Last Cu Level Wire #2. An end portion 210a of Last Cu Level Wire #1 is spaced apart from an end portion 211a of Last Cu Level Wire #2. A typical distance between the ends of the two copper wires would be approximately 100 μm, but could be much greater, as discussed below. A dual damascene process can also be implemented (dual damascene copper is the industry norm).

Next, in the manner described hereinabove, after the last copper level 108, the diffusion barrier cap 114 (a different portion of the same cap 114 which is shown in FIG. 1A) is deposited, followed by the LV insulator layer 116 (a different portion of the same LV insulator layer 116 which is shown in FIG. 1A), followed by more silicon nitride (not shown).

Next, in the manner described hereinabove, the LV resist (not shown, refer to 120) is deposited on top of the LV insulating layer 116, and is patterned, using a LV mask (not shown, refer to 124). The resist (120) is positive resist, as described hereinabove.

As mentioned above in the discussion of the prior art, a LV mask 124 is used to expose the LV resist 120, the LV mask 124 having openings 126 in a pattern corresponding to where it is desired to etch the underlying LV insulator layer 116 to be etched (using "positive" resist) and form pad shapes. The LV resist 120 could be illuminated with a UV laser, but for forming aluminum pads 140 over last copper level copper pads 118, this would not make good sense. Stepper exposure, using a mask 124 is greatly preferred for the highly repetitive task of making identical openings in the LV insulating layers of several IC die (chips) on a wafer.

In this embodiment of the invention, the TM aluminum level 130 is used to make a "custom" connection after "regular" (FIGS. 1A–1F) LV insulator 116 exposure is done using a conventional positive photoresist 120 and mask 124, by exposing (FIG. 2) additional areas of the LV resist 120 before developing the resist, using a UV laser. This additional exposure is indicated be the arrows in FIG. 2. The additional exposures can be in the shapes of squares, rectangles, circles, etc., and they would be done in as many spots as desired using a UV laser. A plurality (such as tens) of overlapping spots will expose connection shapes in the LV resist 120. (These connection shapes will eventually lead to the formation of connecting links.) Aligned laser exposure equipment analogous to the equipment that is used for conventional BEOL fuse-blow could be used, except that the laser wavelength for the present invention would be UV in order to expose the photoresist 120, as opposed to the infrared wavelength which is used for fuse-blow. The resist 120 is then developed in the normal manner, followed by the standard LV insulator RIE (FIG. 1C), resulting in second openings 228 (compare first openings 128) being formed in (through) the LV insulator layer 116 and barrier cap 114 over the end portions 210a, 211a of Last Cu Level Wire #1 and Last Cu Level Wire #2, respectively. The remaining resist is then cleared off the LV insulator 116.

The areas of laser exposure, in addition to the areas exposed through the LV mask 124, are therefore cleared of LV insulator 116 and cap 114 (using RIE), allowing the TM AlCu metal 230 to "dip down" (fill the opening 228 in the LV insulator 116) and connect a pair of (including two or more) last level copper wires, as shown in FIG. 2. In this example, the end portions 210a and 211a of the "Last Cu Level Wire #1" and the "Last Cu Level Wire #2", respectively, are connected by the TM aluminum connection shape (or connecting link) 230.

At this stage of the process, the excess aluminum 130 and the adjoining metallic (e.g., TaN, TiN) layers could be removed by CMP, in a manner similar to planarizing the underlying copper damascene levels, leaving aluminum connecting links 230 in the openings 228 of the LV insulator 116, directly over and connected with the end portions 210a and 211a of the "Last Cu Level Wire #1" and the "Last Cu Level Wire #2", respectively, without there being any aluminum 130 remaining atop the LV insulator 116 adjacent the opening. Preferably however, the aluminum 130 and the adjoining metallic (e.g., TaN, TiN) layers are patterned by conventional metal reactive ion etching (RIE), as follows.

The TM mask 134 is designed such that all possible aluminum connection shapes (230) can be formed. In other words, at all possible locations for aluminum connection shapes, there is no hole (136) in the mask 134. As shown in FIG. 2, for a pair of conductive lines (Last Cu Level Wires #1 and #2) which are desired to be connected, the laser exposure of the LV insulator 116 is performed, an openings 228 will be formed, and the connection shape 230 of TM aluminum will fill the opening 228, thereby forming a complete connecting link which makes an electrical connection between the pair of conductive lines (Last Cu Level Wires #1 and #2) which are desired to be connected.

A significant thing to note in FIG. 2 (which in this regard is true for all the embodiments described herein) is that the desired connecting link 230 which connects the pair of conductive lines (Last Cu Level Wires #1 and #2) is essentially one big opening 228 in the LV insulator 116 filled by metal (in this case, AlCu). Any metal which is not within the LV layer, but rather which is atop the LV insulator 116 is superfluous for the purpose of effecting a connection between the pair of conductive lines (Last Cu Level Wires #1 and #2). Hence, as noted above, such excess aluminum 130 could be removed.

Significantly, the metal 230 connecting the pair of (two) last Cu level wires is in a single opening 228 and is in the plane of the LV insulating layer 116. This is in stark contrast to any "conventional" connecting scheme wherein there would be a via for each wire through the insulating layer and the connecting link would necessarily be atop the insulating layer. In the invention, a single opening 228 in the insulating layer 116 spans a distance between and allows for the connection of a pair of wires, without requiring any metallization atop the insulating layer. The "essential" connecting link is in the opening 228—any residual metal atop the insulating layer is generally superfluous insofar as effecting the desired connection is concerned.

Figure 2A:
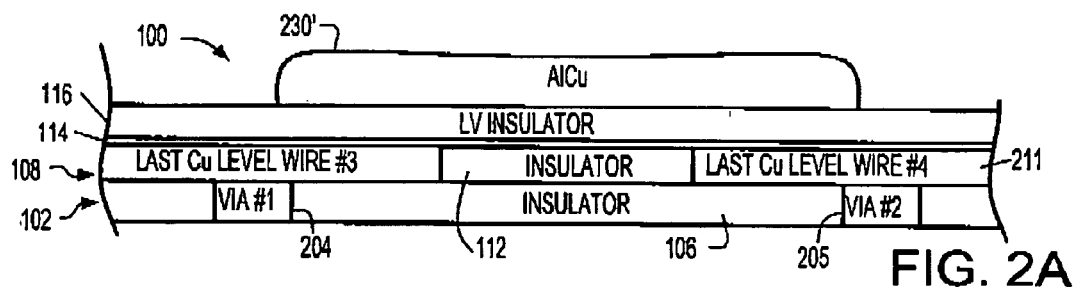

As shown in FIG. 2A, for a pair of conductive lines (Last Cu Level Wires #3 and #4) which are not desired to be connected, the openings 228 in the LV insulator 116 are not formed and the connection shape 230' of the TM aluminum will simply sit on top of the LV insulator 116 (not dipping down to the underlying Last Cu Level Wires #3 and #4), other than at over an opening 228, thereby forming an "incomplete" connecting link and making no connection between the pair of conductive lines (Last Cu Level Wires #3 and #4) which are not desired to be connected. In this manner, a custom connection may be made between selected pairs of conductive lines of a wiring level at relatively low cost, requiring only the extra laser expose step. In other words, in this embodiment, the LV and TM masks are the same, whether or not it is desired to form a complete or an incomplete connecting link between pairs of conductive lines, the difference between connecting and not connecting depending on whether or not the additional laser exposure step of LV insulator 116 was performed over appropriate portions (e.g., end portions 210a, 211a) of a given pair of conductive lines.

In this embodiment, it is in the second (laser) LV exposure step of the LV resist that the decision whether to connect or not connect pairs of conductive lines is made. In all cases (whether connecting or not) the connection shape is present in the TM mask. Nothing special need be done vis-a-vis etching the aluminum. All the connection "shapes" are made—the difference being whether there is an opening in the LV insulator so that the connecting link can be completed (when there is an opening in the LV insulator) or not (when there is no opening in the LV insulator). A connection shape which is over an opening forms a complete link which makes a connection between a pair of conductive lines which are desired to be connected, and a connection shapes which is not over an opening forms an incomplete links which does not make a connection between a pair of conductive lines which are not desired to be connected.

In FIG. 2, it is illustrated that the end portions 210a and 211a of the Last Cu Level Wire #1 and the Last Cu Level Wire #2, respectively, are relatively close to one another, and they are connected by the aluminum connecting shape (complete link) 230. It is within the scope of the invention that the two last level copper wires (conductive lines) to be connected, could be far apart, such as several hundred microns from one another. Using the technique of FIG. 2, this could require several spot exposures of the UV laser.

The process described with respect to FIGS. 2 and 2A could be implemented with negative rather than positive TM resist 132.

An alternative for making customized connections by performing a second exposure of LV resist would be to fabricate a single LV mask which has all of the openings required to make the normal aluminum pads as well as the custom (individualized, per die) connection shapes. (The single LV mask would define all the pad shapes and only those connection shapes for which it is desired to form complete connecting links.) The TM mask could be the same for all of the die, having all the possible (versus only the custom) connection shapes. However, such an LV mask would need to be specific for each die, and possibly for each wafer, and economies of scale would soon vanish. This is considered to be a less viable alternative.

Figure 3A:
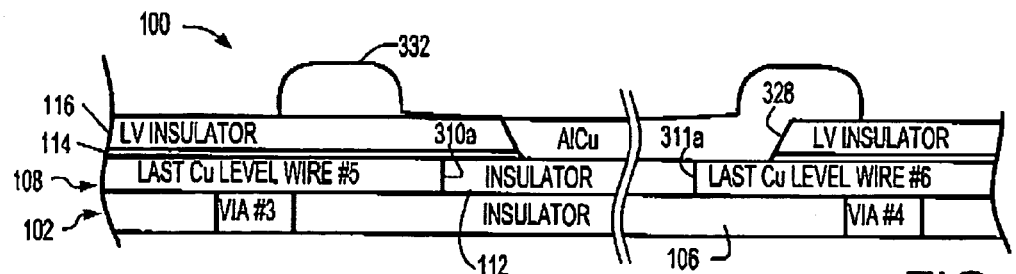
FIGS. 3A and 3B are cross-sectional views of another embodiment of the invention wherein a custom connection selectively made (FIG. 3B) or not made (FIG. 3A) between two or more last level copper wires.
Figure 3B:
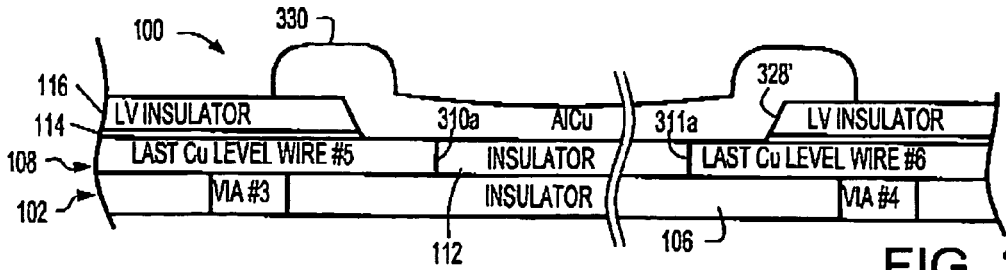

FIGS. 3A and 3B show an embodiment of the invention, wherein the two last level copper wires (conductive lines) to be connected (Last Cu Level Wire #5 and Last Cu Level Wire #6) are far apart, such as several hundred microns from one another. What is being shown in FIGS. 3A and 3B is happening at another location on the IC chip 100 than what is happening in FIGS. 1A–1F. In this embodiment, the normal LV and TM masks are designed to allow the formation of a partial (inchoate, incomplete) aluminum connection shape 332 (also referred to as "extension") in third opening 328 (compare second opening 228) extending from the end portion 311a (compare 211a) of one copper wire (Last Cu Level Wire #6) nearly to the end portion 310a (compare 210a) of the other copper wire (Last Cu Level Wire #5)—for example to within about 100 microns of the other copper wire.

FIG. 3A shows that in cases where a connection is not desired, the third opening 328 in the LV layer extends only partially from the one copper wire (#6) to the other (#5). Then, when filled with metal, an incomplete connecting link results. In all cases (whether or not a connection is desired), at least the third opening 328 is formed (as determined by the LV mask) and the connection shape is formed (as determined by the TM mask).

When a connection is desired, the opening 328 is essentially enlarged. Rather than having to expose several hundred microns (e.g.) of LV resist 120, the laser is used to expose a separate relatively small (e.g., 100 micron) shape in the LV resist 120 to allow the TM aluminum 130 to complete a connection of the aluminum extension (incomplete connecting link) 332 to the other copper wire in the manner described hereinabove with respect to FIG. 2. This is shown in FIG. 3B, wherein the connecting shape forms a complete connecting link 330 (compare 230). In other words, instead of having to make a huge opening with the laser to permit a connection shape to connect two wires (as in FIG. 2), in all cases (for all possible connections) the two wires are almost connected—and only a short addition need be made using the second laser exposure to complete connections between selected pairs of wires.

In FIG. 3B, the completed aluminum connection shape is designated 330 (compare 230) and is essentially identical to the aluminum connection shape 230 of FIG. 2, except that it is much longer (wider), as indicated by the "break lines" in FIG. 3B. In other words, instead of having to do all the "work" of connecting two wires which are far apart with a long connection shape 330 on a individualized die-by-die basis, when a connection between the wires is desired, only a short additional connecting shape need be made between the two far-apart wires, one of which always (for all die) has an aluminum extension 332 associated therewith, to complete the otherwise incomplete connecting link between the two wires.

In other words, in the "normal" LV etch step (e.g., for forming aluminum pads, as described hereinabove), the LV resist 120 is exposed so that in all cases (both for pairs of lines which are desired to be connected and for pairs of conductive lines which are not desired to be connected) an opening 328 is formed which only partially spans a distance between end portions 310a and 311a of the conductive lines (Last Cu Level Wire #5 and Last Cu Level Wire #6), resulting in an partial connection shape (incomplete connecting link) 332, as shown in FIG. 3A. Then, to connect the pair of conductive lines, the additional laser exposure (e.g., one spot) is selectively done at LV resist so that the opening 328' is enlarged and the connection shape completely spans (fully spanning) the distance between the end portions 310a and 311a of the conductive lines (Last Cu Level Wire #5 and Last Cu Level Wire #6), thereby forming a complete connecting link therebetween, as shown in FIG. 3B.

The opening 328 and resulting connection shape 332 which only partially span the distance between the end portions 310a and 311a of the conductive lines (Last Cu Level Wire #5 and Last Cu Level Wire #6) is shown as initially (prior to being enlarged) being contiguous with (an extension of) one of the end portions 310a and 311a of the conductive lines (Last Cu Level Wire #5 and Last Cu Level Wire #6). It is within the scope of the invention that the opening 328 and resulting connection shape 332 is not contiguous with either of the end portions 310a and 311a of the conductive lines (Last Cu Level Wire #5 and Last Cu Level Wire #6), but rather is disposed between the end portions 310a and 311a of the conductive lines (Last Cu Level Wire #5 and Last Cu Level Wire #6), in which case it would be necessary to perform two additional laser exposures at LV resist (one exposure over each of the end portions 310a and 311a) so that the opening completely spans the distance between the two end portions 310a and 311a of the two conductive lines (Last Cu Level Wire #5 and Last Cu Level Wire #6) desired to be connected.

In both embodiments (FIGS. 2/2A and FIGS. 3A/B), the LV and TM masks are the same for all of the dies (IC chips) on a wafer, irrespective of what combinations of pairs of last level wires are intended to be connected with one another. The opening 228 for the connection shape 230 of FIG. 2 is not designed into the LV mask, rather it is made by the second exposure (UV laser) of the LV resist. The opening 328 for the partial connection shape 332 of FIG. 3A is designed into the LV mask, and a second exposure of LV resist is required to complete the connection shape. The process described with respect to FIGS. 3 and 3A could be implemented with negative rather than positive TM resist 132.

An important point should be made here. In both embodiments (FIGS. 2/2A and FIGS. 3A/B), the LV and TM masks are also designed so that aluminum pads 140 will be formed. This is true for all the embodiments of the invention described herein. Although the custom connecting techniques of the present invention are independent of aluminum pad formation, since there is an insulating layer (LV insulator) overlying the last level copper wires, it can safely be assumed that there must be some instrumentality (means) for "normal" wires (e.g., 110) to be connected to, through the overlying insulating layer. Thus, when discussing "pads", what is intended is essentially some kind of connection being made, on a one-to-one basis, to selected ones of the underlying conductive lines (copper wires). And, that this is happening in conjunction with the custom connection techniques of the present invention, which is for making custom connections between two (or more) of the underlying conductive lines (copper wires). In some cases, one or both of the lines which are being custom connected could also have pads formed (preferably at another location along the line) so that signals can be passed to and from these lines irrespective of whether the custom connection is made.

It should be understood that there is nothing "magical" about the connecting links being aluminum and the underlying wires being copper. This dissimilarity of materials is something that needs to be dealt with, such as by the use of barrier layers, etc., but no (for example) etching is being performed which is selective to one of the metals. All of the metals could be the same (or similar) material. Also, there is nothing critical about the number of damascene layers. The invention is, however, directed to having a final damascene wiring layer (in this case, copper layer 108) which defines a functional testable chip, followed by a quasi-damascene insulating layer (in this case, LV insulator 116 having trenches formed and filled (overfilled and etched) therein on a custom, die-by-die basis. It is within the scope of the invention that the laser exposure of LV resist 120 could be used to form all of the openings in the LV insulator 116 including openings for aluminum pads 140 as well as the openings for the aluminum connections 230, but when there are many aluminum structures (e.g., pads or, in the case of FIG. 3A, extensions), it typically makes much more sense and economy of scale to use a mask for these "normal" highly-repetitive die features. However, in an application wherein a substantial percentage of the aluminum structures will be determined on a die-by-die basis, it might just make sense to skip LV mask 124 and do all of the openings (both normal/pad and custom/connecting-shape) using the laser. It is also contemplated that pairs of wires on other than the final damascene wiring layer can be connected using the techniques described herein.

An alternative to the laser exposure (applicable to all embodiments described herein) is to do the additional (some die) exposure of the LV resist 120 with the same stepper used to do the normal (every die) LV exposure, instead of using UV laser. After the conventional LV pattern mask (124) exposure, a separate, second mask would be employed. In its simplest and most general purpose form, the second mask would be an inexpensive mask with only one small generic (e.g., square or rectangular or circular) opening in the chrome. The stepper would detect alignment marks in the usual manner, and then use pre-programmed X and Y offsets to expose squares, rectangles, etc. of LV resist (120) in the appropriate spots. A modern stepper utilized in this manner could conceivably expose a large number of spots per minute in a very flexible manner. As with the laser system, some chips might get no exposures, some might receive one exposure, others might receive numerous exposures, and the exposure patterns could vary greatly from chip-to-chip. Although steppers are typically slower than laser systems (today's infrared laser fuse blow systems can expose thousands of spots per minute), using the stepper would have the advantage of not having to remove the wafer from the stepper tool after the conventional LV mask (124) expose and the photoresist development steps. Even though such a stepper exposure technique does require a second mask, it can be a general purpose mask with only a generic (e.g., square or rectangular or circular) opening in the chrome, and therefore can serve the purpose for many different products. The second mask could of course be more customized if so desired, exposing two or more spots at once, or spots of varying shapes or sizes. (Also, in an embodiment described hereinbelow, a second mask having generic opening(s) can be used instead of a laser for a second exposure of TM resist.)

The connections made by the aluminum shapes 230 and 330 might be thought of as "anti-fuses" or "reverse fuses". Poly diffusion anti-fuses are used today in programmable ASICs, but they generally leave connection resistances on the order of 500 ohms, after being "anti-fused" by forcing a high current through them. The metal-metal antifuses used in programmable ASICs, (which are generally made with tungsten alloy connections) leave connection resistances lower than the poly-diffusion antifuses, but still higher than the aluminum connections made by the invention. The aluminum connections of the present invention can potentially be of much lower resistance and can serve in circuit paths designed to carry high currents if designed appropriately (such as power bus lines at last level).

Figure 6:
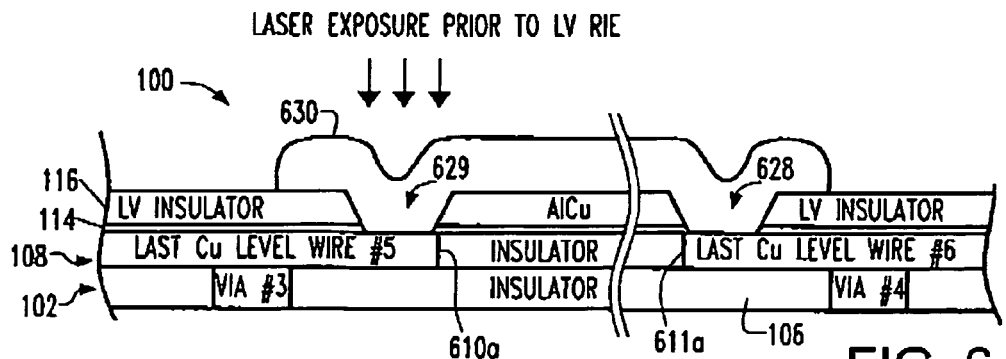
FIG. 6 is a cross-sectional view of another embodiment of the invention wherein a custom connection selectively made between two or more last level copper wires.

FIG. 6 illustrates another embodiment of the invention. This embodiment is similar to FIGS. 3A and 3B in that it is useful for connecting two wires which are far apart. In all cases, an opening 628 over the end portion 611a of the last Cu level wire #6 is designed into the LV mask 124. This would result in an incomplete connecting link (extension) being formed. The connection shape is determined by the TM mask 134. When a connection is desired, an opening 629 is formed over the end portion 610a of the last Cu level wire #5. In this case, there are two openings 628+629 rather than a single opening 328', and the resulting connecting link 630 runs most of its length on top of the LV insulator.

Figure 4:
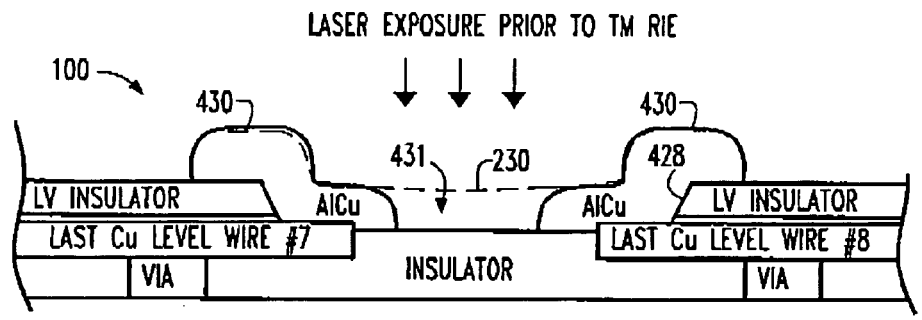
FIG. 4 is a cross-sectional view of another embodiment of the invention wherein a custom connection selectively made (shown in FIG. 2) or not made (shown in this figure) between two or more last level copper wires.

FIG. 4 illustrates another embodiment of the invention showing an aluminum connection 330 (compare 230) that has been "broken". The same LV mask exposure and laser exposure processes can be used to form an opening 428 for the connection shape 430 as are used to form the opening 228 for the connection shape 230 described hereinabove with respect to FIG. 2. The same TM mask exposure can be used to pattern TM resist for the TM metal RIE process—namely, clearing metal outside of pads (240) and connection shapes.

In this embodiment, the connection shapes would be pre-designed into the LV and TM product masks, such that two (or more) last level copper wires would normally be connected by an aluminum connection shape forming a connecting link, as in FIG. 2. This is shown by the broken line 230 in FIG. 4. If it is desired that the connection remain, nothing else needs to be done (i.e., proceed as described hereinabove with respect to FIG. 2). All possible connection shapes are designed into the LV mask, and no additional UV exposure is required. All the possible connection shapes are designed into both the LV and TM masks and, if nothing special is done, all the possible connecting links will be formed. However, if it is desired that a given connection be "broken" (not completed) in a custom manner (only some connections broken, only on certain chips, etc.), then after the conventional TM litho exposure using positive photoresist, an additional UV laser exposure step (arrows) is done so that the TM resist (not shown in this figure, see 132 FIG. 1E) will be removed over a portion of the designed aluminum connection shape (230). The laser (arrows) exposes the TM resist (132, see FIG. 1E) in an area 431 where it was not exposed by the TM mask (134, see FIG. 1E), so that the TM aluminum (130) will be etched away there, and the connection through aluminum connection shape 430 is not made. (The etched away area 431 can be anywhere on the connection shape 430 as long as it does not make a connection between the two copper wires #7 and #8.) This partial connection shape 430 is another example of an incomplete connection link (compare the incomplete link 230' in FIG. 2A, and the extension 332 in FIG. 3A). As is shown, during metal RIE, etching will expose the underlying insulator of the last wiring level in the area 431.

Although it is shown in FIG. 4 that the connection shape 430 is broken in the middle, it should be understood that it could be broken anywhere, such as at one end portion, so that a connection between the two conductive lines (#7, #8) is not made. Also, the two conductive lines can be far apart, as discussed hereinabove.

In the embodiment of FIG. 4, pads shapes and all possible connection shapes may be designed into the LV mask of the LV level. (Alternatively, the pad shapes can be designed into a LV mask and the connection shapes can be UV exposed.) All possible connection shapes are designed into the TM mask so that complete connecting links can be formed. Whether (or not) they are formed depends on whether laser exposure is performed to "break" the connecting link.

It should be understood that the link 430 is not "broken" in the conventional manner of having first existed as a fully formed link then being blasted away by a laser. Rather, the link 430 is broken in the sense that the precursor for forming the link—in this case, the TM resist (132)—was made soluble by a laser (then removed during resist developing) so that a portion of the connecting link otherwise being formed is removed in the normal TM RIE etch step of removing unwanted (not masked by photoresist) TM aluminum (130).

In the embodiment described immediately hereinabove (FIG. 4), the LV and TM masks are both patterned for all possible links. A UV laser is not used to pattern LV resist 120, as in previous embodiments (e.g., FIGS. 2/2A, 3A/3B). Rather, a UV laser is used to pattern TM resist 132 to cause partial connection shapes (incomplete connecting links) 430.

In a variation of the embodiment described immediately hereinabove (FIG. 4), connection shapes which are desired to be made, then broken, can be formed using the two exposure of LV resist procedure described above (e.g., LV mask for pads, laser for connection shapes, as in FIG. 2). And, as described with respect to FIG. 4, a second UV laser would be used to pattern TM resist 132 to cause broken links 430.

In both cases, where a UV laser is used to pattern TM resist 132 to cause broken links 430, rather than using a laser to expose TM resist for making broken links, a second mask could be used. (This is similar to how a second mask could be used instead of a laser for performing the additional exposure of LV resist, as described hereinabove.) In its simplest and most general purpose form, the second mask would be an inexpensive mask with only one small generic (e.g., square or rectangular or circular) opening in the chrome. The stepper would detect alignment marks in the usual manner, and then use pre-programmed X and Y offsets to expose squares, rectangles, etc. of TM resist (132) in the appropriate spots. A modern stepper utilized in this manner could conceivably expose a large number of spots per minute in a very flexible manner.

As with the laser system, some chips might get no exposures, some might receive one exposure, others might receive numerous exposures, and the exposure patterns could vary greatly from chip-to-chip. Although steppers are typically slower than laser systems (today's infrared laser fuse blow systems can expose thousands of spots per minute), using the stepper would have the advantage of not having to remove the wafer from the stepper tool after the conventional LV mask (124) expose and the photoresist development steps. Even though such a stepper exposure technique does require a second mask, it can be a general purpose mask with only a generic (e.g., square or rectangular or circular) opening in the chrome, and therefore can serve the purpose for many different products. The second mask could of course be more customized if so desired, exposing two or more spots at once, or spots of varying shapes or sizes.

As described above, in normal (prior art) fusing, a fully formed fuse is laser-blasted. This is literally "breaking" a connection. In the FIG. 4 embodiment, the material being worked on to form a link is laser-blasted during the process of forming the link, but a fully formed link is never formed, so this is only analogous to "breaking" a connection. In the FIGS. 2/2A embodiment, either a connecting link is formed (FIG. 2) or an incomplete connecting link is formed (FIG. 2A). No "breaking" of a link is involved. In the FIGS. 3A/3B embodiment, an incomplete connecting link is always formed, and the rest of the connecting link is either formed or not. No "breaking" of a link is involved. In the FIG. 4 embodiment, either a complete connecting link is formed, or an incomplete connecting link is formed.

Figure 5:
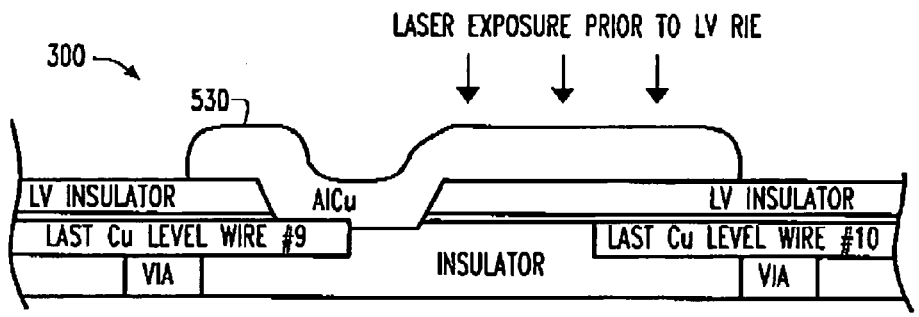
FIG. 5 is a cross-sectional view of another embodiment of the invention wherein a custom connection selectively made (shown in FIG. 2) or not made (shown in this figure) between two or more last level copper wires.

FIG. 5 illustrates an alternate embodiment of "breaking" a connection. In this embodiment, a negative resist is used at LV level, rather than the positive LV resist (120) discussed hereinabove. Negative resist is initially soluble, and exposure to light makes it insoluble. So, using the product specific LV mask, aluminum pads and all possible connection shapes would not be illuminated and would remain insoluble—everything else around the pad shapes and connection shapes would be illuminated and become soluble. If no subsequent UV laser exposure were performed of LV resist, then all the openings would be formed and would fill with aluminum, and all the possible connection shapes (connecting links) would be made (unless, for example, the TM resist were exposed to "break" a given link, as described with respect to FIG. 4). To prevent a connection shape from being completely formed, the UV laser (see arrows) is brought in to expose an area in the negative LV resist to prevent opening the LV insulator, such as over ends of two copper wires (#9. #10). In this case, the laser leaves (makes insoluble) LV resist (120) where it exposes, thereby masking the LV RIE in selected spots and therefore not allowing the connection shape 530 to complete the connection between the Last Cu Level Wires #9 and #10. Again, this is not literally "breaking" a connection in the sense of prior art fusing wherein a fully formed fuse is laser-blasted. In this embodiment, the material (LV insulator) underlying the material (TM aluminum) which would otherwise form the connecting link is prevented from contacting and connecting the underlying copper wires (#9. #110). The TM mask would be designed for all possible connection shapes, and for those where the laser exposure of LV resist prevented forming an opening in the LV insulator, the situation is analogous to the situation in FIG. 2A where no opening (228) was formed for the TM aluminum 130 to dip down and contact the two wires (#3, #4) which would otherwise be connected. Since (in both cases) a complete connecting link is never formed (an incomplete connecting link is formed), so this is only analogous to "breaking" a connection. As described previously, a stepper exposure using a simple, general purpose mask could be substituted for the laser exposure, for any of these embodiments. The process described with respect to FIG. 5 could be implemented with negative rather than positive TM resist 132.

In the embodiment of FIG. 5, pads shapes and all possible connection shapes are be designed into the LV mask of the LV level. Because negative resist is used, the laser can come in and "break" selected ones of the connection shapes. All possible connection shapes are designed into the LV mask so that complete connection shapes can be formed. Whether (or not) they are formed depends on whether laser exposure is performed to "break" the connection shapes.

In another embodiment (not shown), the LV and TM masks are made so that every connection can be formed. The LV insulator has openings for all possible connections. As was the case with the embodiment described with respect to FIG. 4, In this embodiment, LV and TM shapes would be pre-designed into the LV and TM product masks, such that two (or more) last level copper wires would normally be connected by an aluminum connection shape as in FIG. 2. In the FIG. 4 embodiment, positive TM resist was used, and the laser came in to "break" the TM resist which otherwise would allow a connecting shape (dashed line 230) to form. According to this embodiment of the invention, in an analogous manner, the use of a negative resist at TM litho in conjunction with laser exposure of TM resist would leave aluminum 130 in selected spots, allowing custom connections to be made. As described previously, a stepper exposure using a simple, general purpose mask could be substituted for the laser exposure, for this embodiment.

It should be understood that throughout the descriptions of various embodiments set forth herein that the terms "connection shape" and "connecting link" are used nearly synonymously. The difference, if any, is subtle. Generally, the formation of a "shape" precedes the formation of a "link". Also, the connection shapes are indicative of what is designed into the masks and/or patterned into the resist—the connecting links are generally the resulting structure which is intended to custom connect two underlying wires. Often a partial connection shape is formed, and only an incomplete connecting link is formed.

The following is a tabularization of the various embodiments of the invention (plus FIGS. 1A–1F prior art) described hereinabove. It is not meant to be exhaustive, merely illustrative.

| FIG | LV resist | LV mask | Second LV Exposure | TM resist | TM Mask | Second TM exposure | results |
|---|---|---|---|---|---|---|---|
| 1A–1F | Pos | pad shapes | N/A | pos | pad shapes | N/A | Pads are formed (Prior Art) |
| 2 | Pos | pad shapes | yes, for connection shapes | pos | pad shapes and all possible connection shapes | No | Pads and complete connecting links |
| 2A | Pos | pad shapes | No | pos | pad shapes and all possible connection shapes | No | Pads and incomplete connecting links |
| text only | Pos | pad shapes, connection shapes as required | No | pos | pad shapes, and all possible connection shapes | No | Pads and complete connecting links |
| 3A | Pos | pad shapes, partial connection shape | No | pos | pad shapes and all possible connection shapes | No | Pads and incomplete connecting links |
| 3B | Pos | pad shapes | yes, to complete connection shapes | pos | pad shapes and all possible connection shapes | No | Pads and complete connecting links |
| 4 | Pos | pad shapes and all | No | pos | pad shapes and all | yes, to "break" | Pads, and incomplete |

-continued

| FIG | LV resist | LV mask | Second LV Exposure | TM resist | TM Mask | Second TM exposure | results |
|---|---|---|---|---|---|---|---|
| | | possible connection shapes | | | possible connection shapes | connnection shapes | connecting links |
| text only | | pad shapes | yes, for connection shapes | pos | pad shapes and all possible connection shapes | yes, to "break" connnection shapes | Pads, and incomplete connecting links |
| 5 | Neg | pad shapes and all possible connection shapes | yes, to "break" connection shapes | | pad shapes and all possible connection shapes | No | Pads, and incomplete connecting links |
| text only | Pos | pad shapes and all possible connection shapes | No | neg | pad shapes and all possible connection shapes | yes, to "break" connnection shapes | Pads, and incomplete connecting links |

The inventive method of breaking connections can essentially accomplish the same thing as standard BEOL laser fuse blow, where copper lines are made discontinuous by ablation/explosion of the line in certain areas with an infrared laser. Although the standard fuse blow can be done at a later point in the processing (after C4) than the invention, the standard fuse blow causes insulator cracking, which creates a concern for damage to surrounding circuits. The standard fuses are also left open to the environment after fuse blow, which creates a concern for metal corrosion. There is also a potential for "reconnection" through electromigration of laser fuse blown circuits. Careful chip/package interaction qualifications must be run for each technology to address these concerns. The connections which are made discontinuous by the invention have no insulator damage associated with them, and they are completely encapsulated by subsequently deposited insulator layers, not shown, (which essentially negates any corrosion and electro-migration/reconnection concerns).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of making connections to wires in a wiring level of a damascene interconnect structure which is a last of several wiring levels before top metal metallization is performed comprising the steps of:

depositing an insulating layer atop the wiring level;
depositing a first photoresist on the insulating layer;
in a first exposure step, exposing first shapes in the first photoresist so that in a subsequent insulating layer etch, first openings will be formed through the insulating layer extending to selected areas of selected ones of the wires;
in a second exposure step, exposing second shapes in the first photoresist so that in the subsequent insulating layer etch, second openings will be formed through the insulating layer extending to portions of pairs of the wires which are desired to be connected;
performing the subsequent insulating layer etch so that the first openings and second openings are formed through the insulating layer; and
performing top metal metallization, wherein metal fills the first openings and the second openings in the insulating layer.

2. The method, according to claim 1, further comprising the steps of:

depositing a second photoresist atop the metallization; and
exposing the second photoresist so that in a subsequent metallization etch, connection shapes are formed in the top metal.

3. The method, according to claim 2, including the steps of:

forming a first portion of the connection shapes over the second openings, thereby forming complete connecting links for the pairs of wires desired to be connected; and
forming a second portion of the connection shapes at other than over the second openings, thereby forming incomplete connecting links for pairs of wires which are not desired to be connected.

4. The method, according to claim 1, further comprising the steps of:

providing a mask for performing the first exposure step; and
using a UV laser to perform the second exposure step.

5. The method, according to claim 1, further comprising the steps of:

providing a first mask for performing the first exposure step; and using a second mask having generic openings to perform the second exposure step.

6. The method, according to claim 1, further comprising the step of selecting the first photoresist as a positive photoresist.

7. The method, according to claim 1, further comprising the steps of:
    selecting the wires of the wiring level to comprise copper, and
    selecting the metal of the metallization to comprise aluminum.

8. The method, according to claim 1, further comprising the step of selecting the wiring level to be a last damascene wiring level.

9. The method, according to claim 1, further comprising the step of forming the insulating layer approximately 1 micron thick.

10. The method, according to claim 1, further comprising the step of performing the first and second exposure steps using a single mask for defining the first shapes and the second shapes.

11. The method, according to claim 1, further comprising the steps of:
    providing third openings in the insulating layer which extend only partially between the portions of pairs of the wires which are desired to be connected; and
    enlarging the third openings in a third exposure step to become second openings.

12. The method, according to claim 11, further comprising the step of filling the third openings in the insulating layer with metal thereby forming incomplete connecting links between pairs of the wires which are not desired to be connected.

13. A method of making custom connections between conductive lines of a wiring level which is a last of several wiring levels before top metal metallization is performed, comprising the steps of:
    depositing an insulating layer atop the conductive lines;
    etching openings through the insulating layer over portions of pairs of conductive lines for making all possible connections between pairs of conductive lines;
    depositing metal on the insulating layer and in the openings;
    depositing photoresist atop the metal;
    exposing the photoresist in a first exposure step, so that in a subsequent metal etch, metal connecting links will be formed between pairs of conductive lines which are desired to be connected; and
    exposing portions of the photoresist in a second exposure step, so that in a subsequent metal etch, some of the metal connection shapes will only partially be formed, thereby forming incomplete connecting links between pairs of conductive lines which are not desired to be connected.

14. A method, according to claim 13, further comprising the steps of:
    performing the first exposure step with a mask; and
    perform the second exposure step with a UV laser.

15. A method, according to claim 13, further comprising the steps of:
    performing the first exposure step with a first mask; and
    performing the second exposure step using a second mask having generic openings.

16. A method, according to claim 13, further comprising the step of selecting a positive photoresist for the photoresist.

17. The method, according to claim 13, further comprising the step of forming the last level wires of a damascene structure as conductive lines.

18. A method, according to claim 13, further comprising the step of forming the last level wires of copper.

19. A method, according to claim 13, further comprising the step of forming the last level wires of aluminum.

20. A method, according to claim 13, further comprising the step of forming the insulating layer to be approximately 1 micron thick.

21. A method of making connections to wires in a wiring level of a damascene interconnect structure which is a last of several wiring levels before top metal metallization is performed comprising the steps of:
    depositing an insulating layer atop the wiring level;
    depositing a photoresist on the insulating layer;
    in a first exposure step, exposing first portions of the photoresist so that in a subsequent insulating layer etch, openings can be formed through the insulating layer extending to portions of selected pairs of the wires;
    in a second exposure step, exposing second portions of the photoresist so that in the subsequent insulating layer etch, the second openings will only partially be formed, thereby forming incomplete connecting links between selected pairs of wires,
    performing the subsequent insulating layer etch;
    performing metallization, wherein metal overfills the openings; and
    forming connecting shapes in the metallization;
    thereby forming complete connecting links between pairs of wires which are desired to be connected and forming incomplete connecting links between pairs of conductive lines which are not desired to be connected.

22. The method, according to claim 21, further comprising the steps of:
    providing a mask for performing the first exposure step; and
    using a UV laser to perform the second exposure step.

23. The method, according to claim 21, further comprising the steps of:
    providing a first mask for performing the first exposure step; and
    using a second mask having generic openings to perform the second exposure step.

24. The method, according to claim 21, further comprising the step of selecting a negative photoresist for the photoresist.

25. The method, according to claim 21, further comprising the steps of:
    forming the wires of the wiring level from copper, and
    forming the metal of the metallization from aluminum.

26. The method, according to claim 21, further comprising the step of forming the wiring level as a last damascene wiring level.

27. The method, according to claim 21, further comprising the step of forming the insulating layer approximately 1 micron thick.

* * * * *